United States Patent
Kim et al.

(10) Patent No.: US 9,594,307 B2
(45) Date of Patent: Mar. 14, 2017

(54) EXPOSURE APPARATUS AND METHOD THEREOF

(71) Applicant: Samsung Display Co., Ltd., Yongin (KR)

(72) Inventors: Cha-Dong Kim, Seoul (KR); Hoon Kang, Suwon-si (KR); Chang-Hoon Kim, Asan-si (KR); Sang-Hyun Yun, Suwon-si (KR); Jung-In Park, Seoul (KR); Woo-Yong Sung, Seoul (KR); Ki-Beom Lee, Seoul (KR); Hi-Kuk Lee, Yongin (KR); Jae-Hyuk Chang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 145 days.

(21) Appl. No.: 14/226,621

(22) Filed: Mar. 26, 2014

(65) Prior Publication Data
US 2015/0049316 A1    Feb. 19, 2015

(30) Foreign Application Priority Data

Aug. 19, 2013 (KR) .................. 10-2013-0097720

(51) Int. Cl.
*G03B 27/68* (2006.01)
*G03F 7/20* (2006.01)

(52) U.S. Cl.
CPC ........ *G03F 7/70291* (2013.01); *G03F 7/7055* (2013.01); *G03F 7/70508* (2013.01)

(58) Field of Classification Search
CPC ............. G03F 7/70191; G03F 7/70291; G03F 7/70508; G03F 7/7055
See application file for complete search history.

(56) References Cited

U.S. PATENT DOCUMENTS 5,027,132 A * 6/1991 Manns .................... G03F 7/704
347/225
5,912,726 A * 6/1999 Toguchi .............. G03F 7/70241
355/53

(Continued)

FOREIGN PATENT DOCUMENTS

| JP | 2006-337696 | 12/2006 |
| JP | 2008-250140 | 10/2008 |

(Continued)

*Primary Examiner* — Deoram Persaud
(74) *Attorney, Agent, or Firm* — H.C. Park & Associates, PLC

(57) ABSTRACT

An exposure apparatus includes a light source, an illuminating member, a projecting member, a stage, an inspecting member, and an information processing member. The light source is configured to provide a light in accordance with a pulse event generation (PEG) representing a period of light radiation. The illuminating member is configured to change the light into point lights. The projecting member is configured to project the point lights according to a photoresist shape extending in various directions. The point lights are projected on the stage. The inspecting member is configured to inspect a photoresist pattern formed by the projected point lights. The information processing member is configured to analyze different photoresist patterns corresponding to different PEGs to select one PEG from the different PEGs. The one PEG being associated with a minimum error in the various directions.

18 Claims, 26 Drawing Sheets

(56) References Cited

U.S. PATENT DOCUMENTS

| | | | |
|---|---|---|---|
| 7,339,602 B2* | 3/2008 | Shimoyama | H04N 1/0402 347/233 |
| 7,459,709 B2* | 12/2008 | Timmermans | G03F 7/70291 250/548 |
| 7,463,402 B2 | 12/2008 | Cebuhar et al. | |
| 7,609,362 B2* | 10/2009 | De Jager | G03F 7/70275 355/67 |
| 8,014,585 B2* | 9/2011 | Kinjo | G03F 7/70291 382/141 |
| 8,363,209 B2 | 1/2013 | Shin et al. | |
| 9,013,674 B2* | 4/2015 | Park | G03F 7/70275 355/46 |
| 2004/0109216 A1* | 6/2004 | Nakaya | B41J 25/003 359/237 |
| 2004/0153989 A1* | 8/2004 | Tange | B82Y 10/00 716/55 |
| 2004/0184119 A1* | 9/2004 | Nakaya | H04N 1/047 358/497 |
| 2004/0252180 A1* | 12/2004 | Takada | G03F 7/2051 347/239 |
| 2005/0001895 A1* | 1/2005 | Uemura | B41J 2/465 347/235 |
| 2005/0213071 A1* | 9/2005 | Fukuda | G03B 21/13 355/69 |
| 2005/0286093 A1* | 12/2005 | Sumi | B41J 2/465 358/474 |
| 2006/0001855 A1* | 1/2006 | Lof | G03F 7/70291 355/69 |
| 2007/0146672 A1 | 6/2007 | Bleeker et al. | |
| 2008/0158537 A1 | 7/2008 | Wieland et al. | |
| 2008/0260234 A1* | 10/2008 | Yamashita | G01N 21/95607 382/144 |
| 2009/0040595 A1 | 2/2009 | De Samber et al. | |
| 2010/0045958 A1 | 2/2010 | Wieland et al. | |
| 2010/0123745 A1* | 5/2010 | Nakaya | B41J 2/465 347/9 |
| 2010/0231985 A1* | 9/2010 | Kinjo | G01D 1/00 358/474 |
| 2011/0267594 A1 | 11/2011 | Kim et al. | |
| 2012/0241740 A1 | 9/2012 | Park et al. | |
| 2012/0307215 A1 | 12/2012 | Sano et al. | |

FOREIGN PATENT DOCUMENTS

| | | |
|---|---|---|
| JP | 2012-243917 | 12/2012 |
| KR | 10-2012-0100208 | 9/2012 |
| KR | 10-1214657 | 12/2012 |

* cited by examiner

EXPOSURE APPARATUS AND METHOD THEREOF

CROSS-REFERENCE TO RELATED APPLICATION

This application claims priority from and the benefit of Korean Patent Application No. 10-2013-0097720, filed on Aug. 19, 2013, which is incorporated by reference for all purposes as if set forth herein.

BACKGROUND

Field

Exemplary embodiments relate to an exposure apparatus and an exposure method, and, more particularly, to an exposure apparatus configured to form a minute pattern and an exposure method thereof.

Discussion

Patterns may be formed on a substrate using, for example, a photolithographic process. Photolithography typically utilizes relatively expensive equipment, such as an exposure apparatus, one or more masks, etc. It is noted that photolithographic masks are expendable, and, therefore, photolithographic processes tend to use a relatively large amount of masks to fabricate the same product. Also, photolithographic processes may generate pollution associated with, for instance, a developing agent. To address these issues, patterning techniques to expose substrates to relatively high energy light, such as, for instance, ultraviolet light, laser light, etc., have been developed to directly pattern structures formed on a substrate. When, however, high energy light is directly radiated onto a substrate, the patterning resolution may be relatively low, such that, for example, line widths (or skew) may vary based on an incident angle of the light.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an exposure apparatus configured to form minute patterns, as well as provide an exposure method thereof.

Additional aspects will be set forth in the detailed description which follows, and, in part, will be apparent from the disclosure, or may be learned by practice of the inventive concept.

According to exemplary embodiments, an exposure apparatus includes a light source, an illuminating member, a projecting member, a stage, an inspecting member, and an information processing member. The light source is configured to provide a light in accordance with a pulse event generation (PEG) representing a period of light radiation. The illuminating member is configured to change the light into point lights. The projecting member is configured to project the point lights according to a photoresist shape extending in various directions. The point lights are projected on the stage. The inspecting member is configured to inspect a photoresist pattern formed by the projected point lights. The information processing member is configured to analyze different photoresist patterns corresponding to different PEGs to select one PEG from the different PEGs. The one PEG being association with a minimum error in the various directions.

According to exemplary embodiments, an exposure method includes: intermittently providing a first light to a first photoresist layer according to a first pulse event generation (PEG) representing a period of light radiation; developing the first photoresist layer to form a first photoresist pattern; inspecting error in the first photoresist pattern in various directions; and changing the first PEG to a second PEG. The method further includes: intermittently providing a second light to a second photoresist layer according to the second PEG; developing the second photoresist layer to form a second photoresist pattern; inspecting error in the second photoresist pattern in various directions; and selecting one PEG from the first PEG and the second PEG. The one PEG being associated with the least amount of error between the first PEG and the second PEG.

According to exemplary embodiments, an exposure apparatus may include a digital type apparatus including an optimized exposure condition that includes pulse event generation (PEG). Uniformity of line widths of light beams having passed through a projecting member may be increased so that uniformity of line widths of a formed pattern may also be increased. In this manner, processing margins may be improved.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
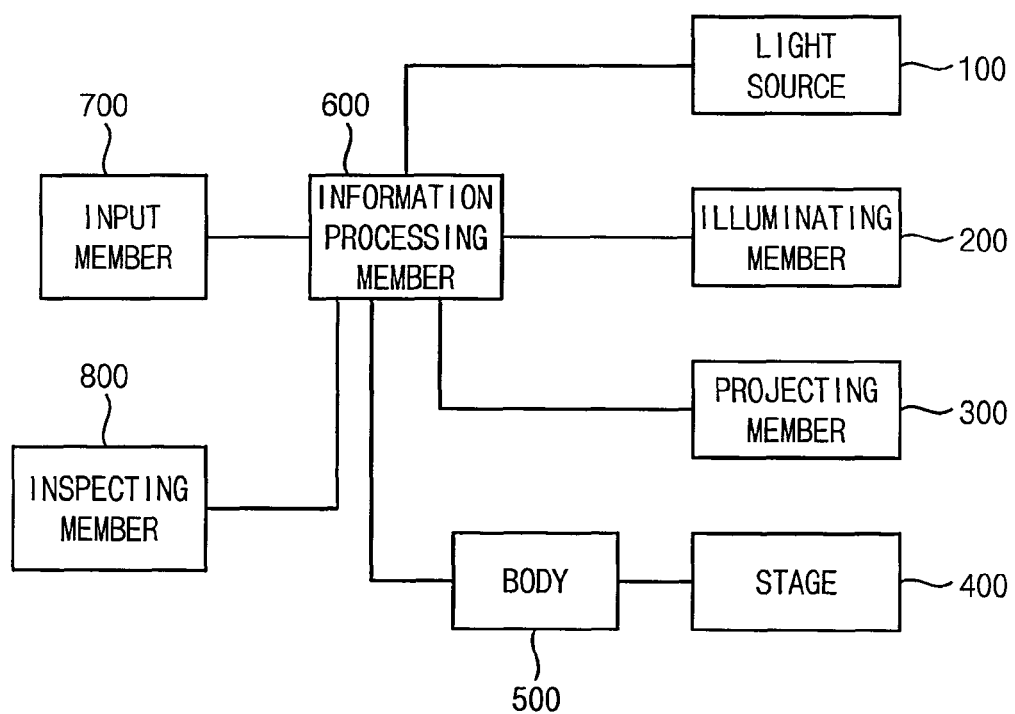
FIG. 1 is a block diagram of an exposure apparatus, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
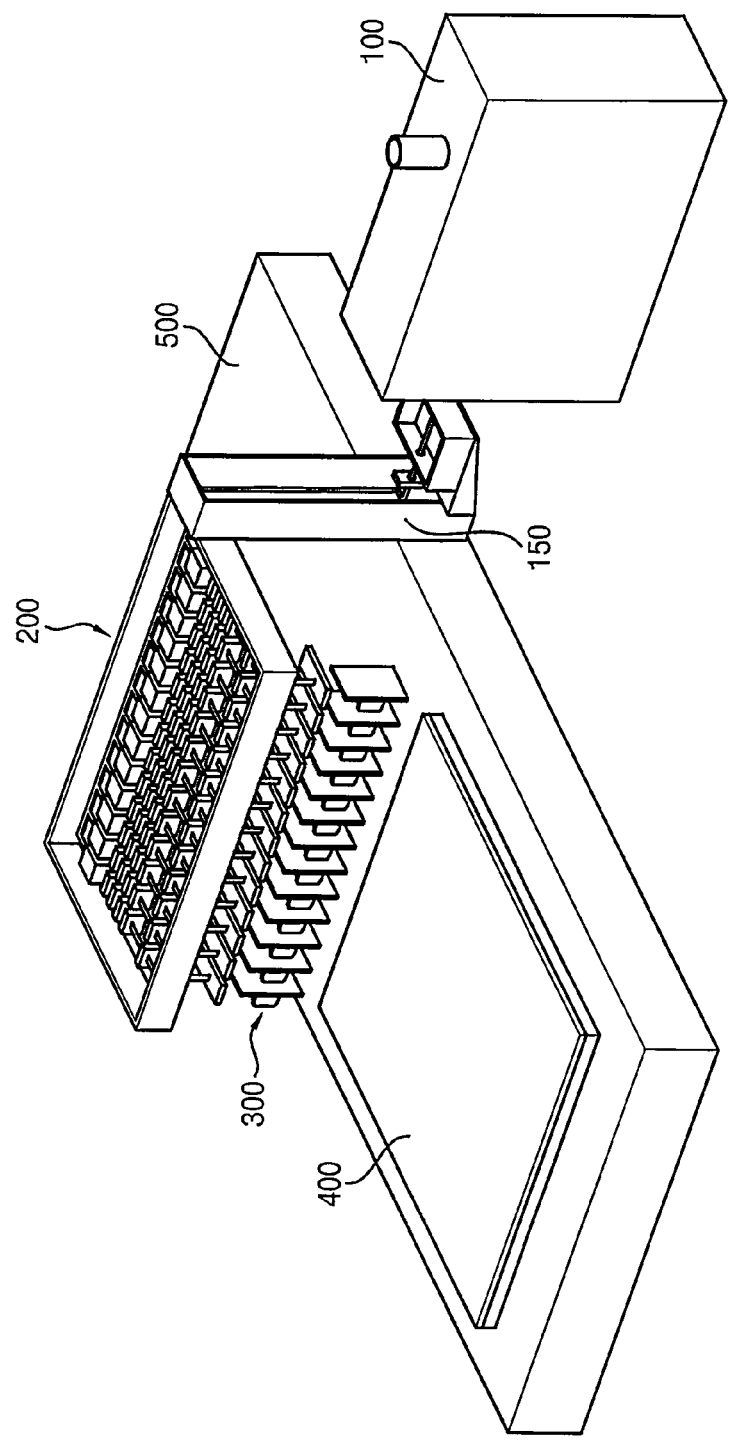
FIG. 2 is a perspective view of a portion of the exposure apparatus of FIG. 1, according to exemplary embodiments.

FIG. 1 is a block diagram of an exposure apparatus, according to exemplary embodiments. FIG. 2 is a perspective view of a portion of the exposure apparatus of FIG. 1.

Referring to FIGS. 1 and 2, the exposure apparatus may include a light source 100, an illuminating member 200, a projecting member 300, a stage 400, a body 500, an information processing member 600, an input member 700, and an inspecting member 800. Although specific reference will be made to this particular implementation, it is also contemplated that the exposure apparatus may embody many forms and include multiple and/or alternative components. For example, it is contemplated that the components of the exposure apparatus may be combined, located in separate structures, and/or separate locations.

According to exemplary embodiments, the light source 100 may be configured to generate light for an exposure procedure. The light may have short and uniform wavelength. For example, the light may include laser light, ultraviolet light, X-ray, blue light, etc. Also, the light may include visible light. In this manner, the light source 100 may include a laser generator. For instance, the light source 100 may include an Excimer laser, a continuous wave (CW) laser, etc. Alternatively (or additionally), the light source 100 may include an ultraviolet generator, an X-ray generator, etc. The light source 100 may be electrically connected to the information processing member 600 to generate the light based on a light source driving signal received from the information processing member 600.

In exemplary embodiments, the information processing member 600, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like. As such, one or more of the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. To this end, the exposure apparatus, and/or one or more components thereof may include or otherwise be associated with one or more memories (not shown) including code (e.g., instructions) configured to cause the exposure apparatus, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Figure 3:
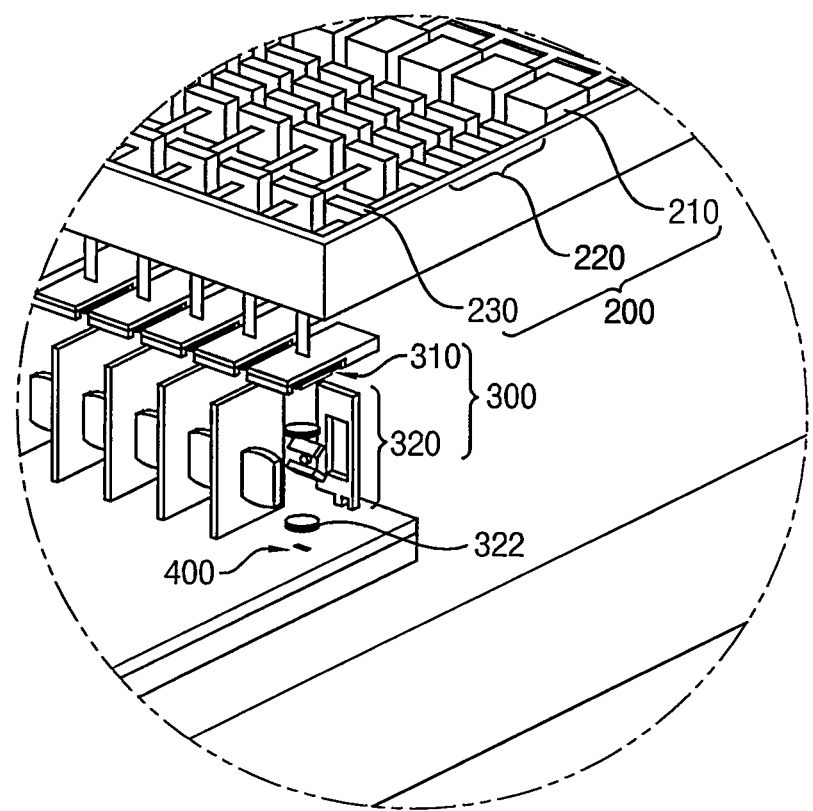
FIG. 3 is an enlarged perspective view of a portion of the exposure apparatus of FIG. 2, according to exemplary embodiments.

FIG. 3 is an enlarged perspective view of a portion of the exposure apparatus of FIG. 2, according to exemplary embodiments.

Referring to FIGS. 1 to 3, the illuminating member 200 may be disposed adjacent to the light source 100. The illuminating member 200 may be optically connected to the light source 100 through a light guide line (or component) 150. The light guide line 150 may be configured to guide the light generated from the light source 100 toward the illumination member 200. The illuminating member 200 may include an attenuator 210, a homogenizer 220 and a condenser 230. The attenuator 210 may control the intensity of light that is guided by the light guide line 150. For example, when the light source 100 is implemented as a laser and the intensity of a laser beam is abruptly increased, the attenuator 210 may be utilized to decrease the abruptly increased intensity of the laser beam.

According to exemplary embodiments, the homogenizer 220 may increase the uniformity of light propagating from, for example, the attenuator 210. In this manner, the homogenizer 220 may increase the uniformity of light that has been intensity controlled. For example, when the light having passed through the attenuator 210 has luminance differences between a center and a peripheral portion (in a cross-sectional view of the light), the homogenizer 220 may be utilized to remove the luminance difference between the center and the peripheral portions. That is, the homogenizer 220 may increase the uniformity of the light, which may be provided to the condenser 230.

The condenser 230 may be configured to condense the light received from, for example, the homogenizer 220. In this manner, the condenser 230 may condense light that has been intensity controlled and made uniform. According to exemplary embodiments, a plurality of lights may be utilized to perform an exposure. Each of the plurality of lights may be a point light, which refers to a point shaped cross-section of the light. For example, the cross-section of the point light may have a circular cross-section, an elliptical cross-section, etc. The condensed light may exit the illumination member 200 and may be guided into the projecting member 300.

In exemplary embodiments, the projecting member 300 may be configured to project light exiting the illuminating member 200 onto the stage 400. The projecting member 300 may be electrically connected to the information processing member 600. In this manner, the projecting member 300 may be configured to individually control the projection of light based on a projection signal received from the information processing member 600. It is noted that the projecting member 300 may include a mask 310 and a projector 320, which are described in more detail in association with FIGS. 4 and 5.

Figure 4:
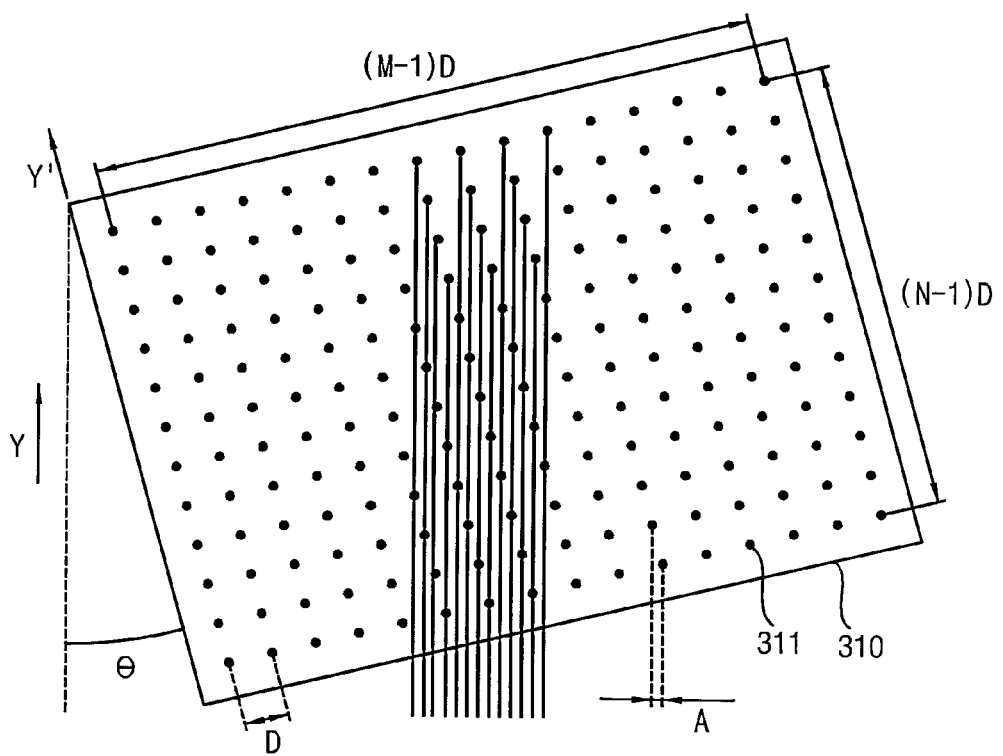
FIG. 4 is a plan view of a mask utilized in the exposure apparatus of FIG. 2, according to exemplary embodiments.
Figure 5:
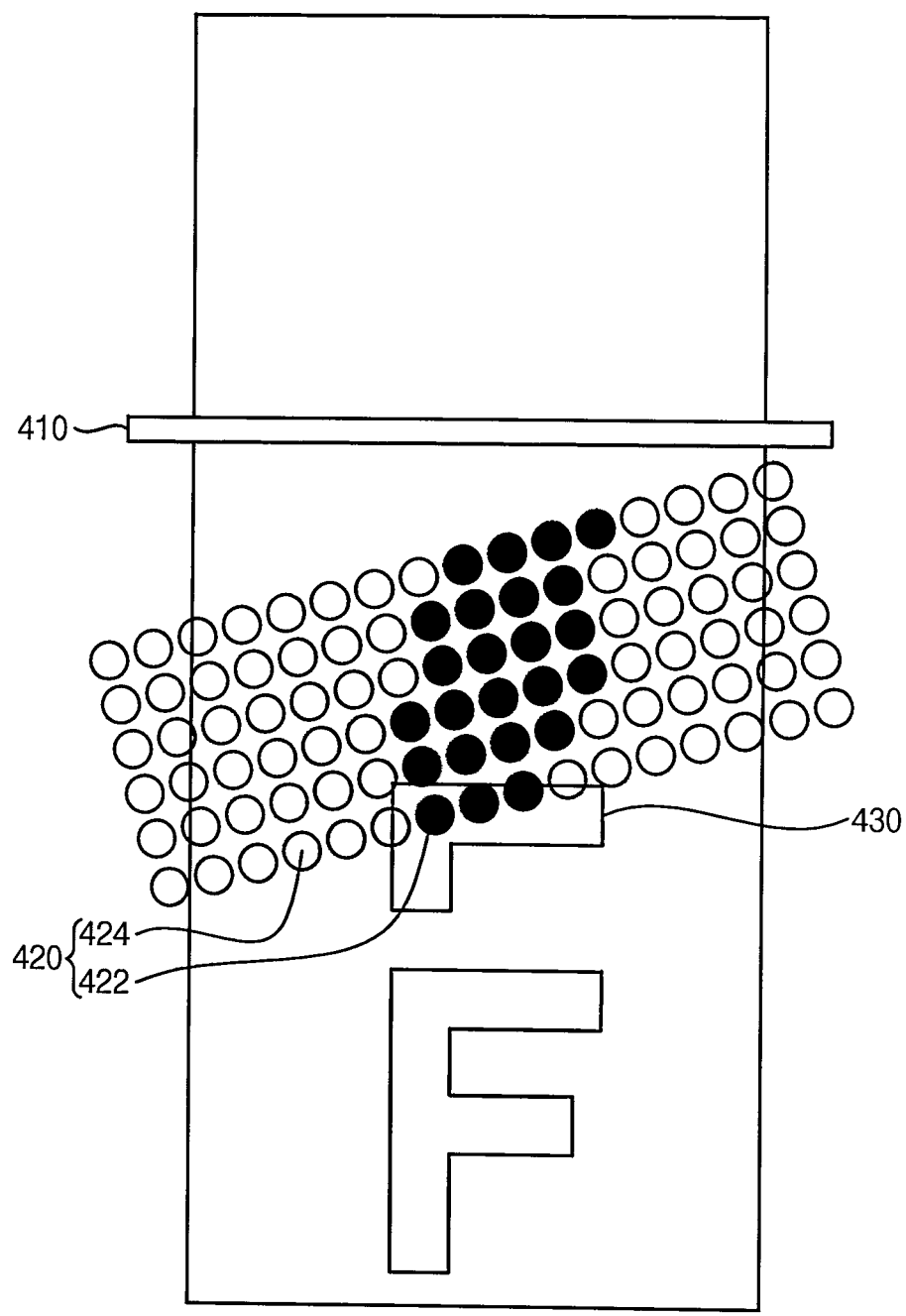
FIG. 5 is a plan view of a stage utilized in the exposure apparatus of FIG. 2, according to exemplary embodiments.

FIG. 4 is a plan view of a mask utilized in the exposure apparatus of FIG. 2, according to exemplary embodiments. FIG. 5 is a plan view of a stage utilized in the exposure apparatus of FIG. 2, according to exemplary embodiments.

Referring to FIGS. 1 to 5, the mask 310 may include a light blocking matrix having, for instance, a plate shape with a plurality of through holes (or apertures) 311 disposed in the light blocking matrix. The through holes 311 may be configured to pass light towards the stage 400. The through holes 311 may be arranged in an M×N matrix (where "M" and "N" are natural numbers) corresponding to a beam radiation array 420.

According to exemplary embodiments, a distance D may separate adjacent through holes 311. To form a pattern having a resolution smaller than distance D, the mask 310 may be arranged in an inclined direction Y' forming an angle θ with respect to a transportation direction Y of the stage 400. When the mask 310 is arranged in the inclined direction Y' that is inclined with respect to the transportation direction Y of the stage 400 by the angle θ, the exposure apparatus may form a minute pattern smaller than the distance D between adjacent through holes 311. Although not illustrated, it is contemplated that the mask may be additionally (or alternatively) angled from a plane parallel (or substantially parallel) to an upper surface of the stage 400. In this manner, a combination of the inclination angles may be utilized to form an even more minute pattern.

In exemplary embodiments, the mask 310 may be transported (or otherwise displaced) via the stage 400 in a direction perpendicular (or substantially perpendicular) to a scan line 410. To this end, the projecting member 300 may radiate light onto first points 422 on the stage 400 through the through holes 311 in the mask 310. It is noted that the through holes 311 correspond to both the first points 422 and second points 424. The first points 422 correspond to a photoresist shape 430 of a photoresist (not shown) formed on a target substrate (not illustrated). The second points 424 correspond to a remaining portion of the photoresist, e.g., a portion of the photoresist not corresponding to the photoresist shape 430.

Adverting to FIG. 3, the projector 320 of the projecting member 300 may be configured to transmit a portion of the light passing through the through holes 311 of the mask 310 corresponding to the first points 422, as well as configured to block a remaining portion of the light passing through the through holes 311 of the mask 310 corresponding to the second points 424. In exemplary embodiments, the projecting member 300 may include a digital micromirror device (DMD). The digital micromirror device may include a plurality of micromirrors. The angular disposition of each of the micromirrors may be changed (or otherwise controlled) based on a signal received from, for example, the information processing member 600. In this manner, the digital micromirror device may be configured to transmit a portion of incident light in a first direction and reflect a remaining portion of the incident light in a different direction from the first direction.

Figure 6A:
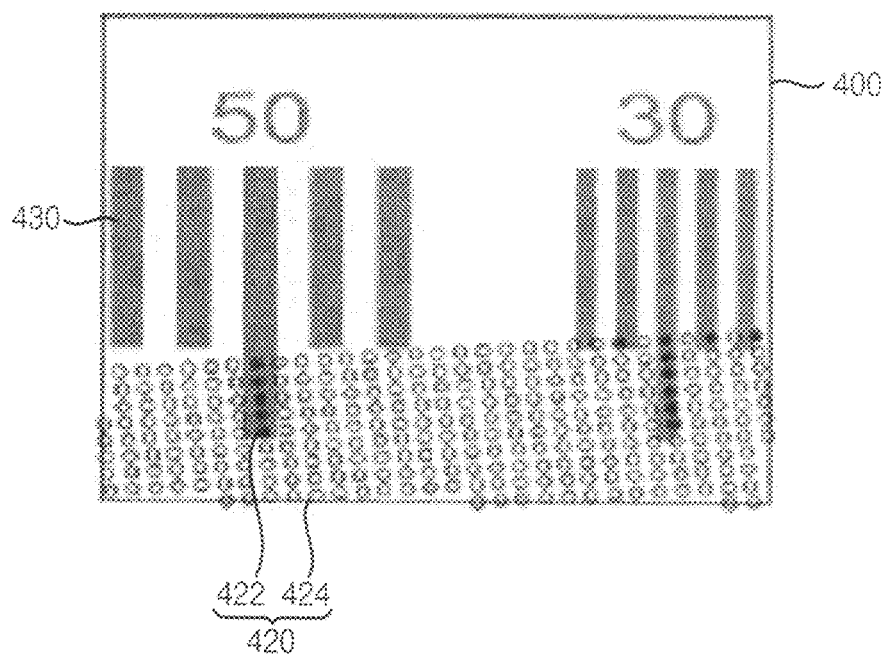
FIGS. 6A to 6C are respective plan views of irradiating light using the exposing apparatus of FIG. 2 to form a photolithographic pattern, according to exemplary embodiments.
Figure 6B:
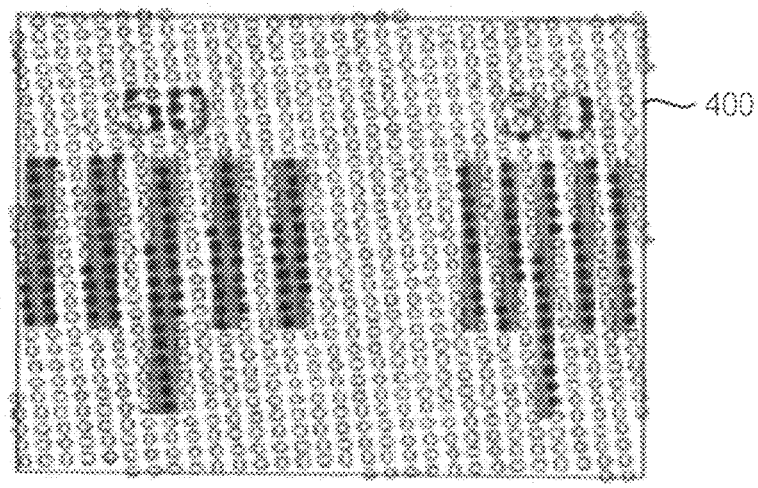
Figure 6C:
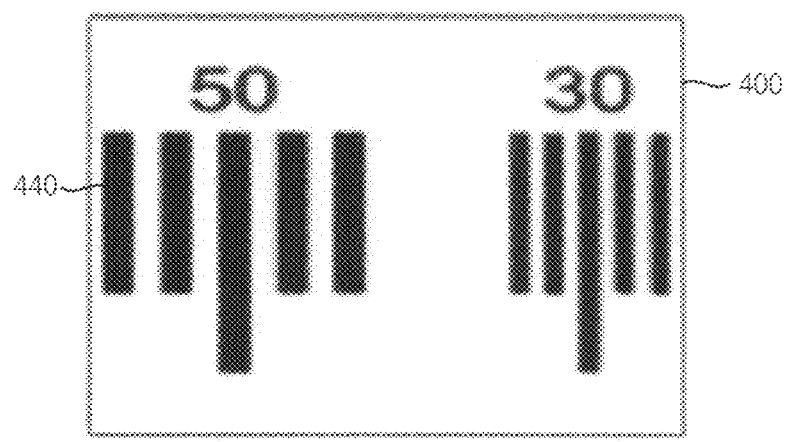

FIGS. 6A to 6C are respective plan views of irradiating light using the exposure apparatus of FIG. 2 to form a photolithographic pattern, according to exemplary embodiments.

Referring to FIGS. 1 to 6A, the mask 310 may be transported from a lower portion of the stage 400 towards an upper portion of the stage 400. That is, the mask 310 may be displaced in a direction perpendicular (or substantially perpendicular) to a direction of the scan line 410. When the mask 310 is transported, light may be radiated onto the photoresist shape 430 through the first points 422.

Referring to FIGS. 1 to 6B, as the mask 310 is transported from the lower portion of the stage 400 towards the upper portion of the stage 400, a new set of first points 422 may overlap a region of the photoresist shape 430, which may have previously been overlapped by a previous set of first points 422. In this manner, each portion of the photoresist shape 430 may be radiated by a total amount of light corresponding to the summed amount of light passing through each set of first points 422 that overlap the portion of the photoresist shape 430 as the mask 310 translates from a starting point to an ending point. As seen in FIG. 6C, the exposed photoresist may be developed to form the photoresist pattern 440.

Figure 7A:
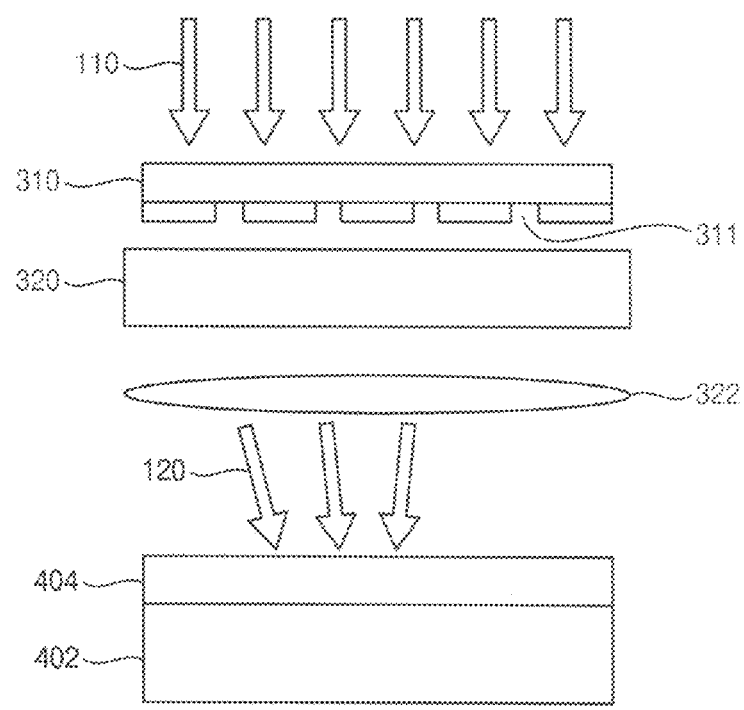
FIG. 7A schematically illustrates an exposure method using the exposure apparatus of FIG. 2, according to exemplary embodiments.

FIG. 7A schematically illustrates an exposure method using the exposure apparatus of FIG. 2, according to exemplary embodiments.

Referring to FIGS. 1 to 7A, a primitive light 110 may pass through the through holes 311 of the mask 310, and, thereby, received in the projector 320. The projector 320 may transmit the portion of the light having passed through the through holes 311 towards the first points 422. The remaining portion of the light received in the projection 320 and corresponding to the second points 424 may be blocked.

A relative distance of between light paths propagating from the first points 422 may be changed (or otherwise controlled) using a lens 322. In this manner, the primitive light 110 may become a projection light 120 after propagating through lens 322. The lens 322 may include a convex lens, which may be configured so that a distance between adjacent projection lights 120 is smaller than a distance between adjacent primitive lights 110. For example, a ratio between the distance between adjacent projection lights 120 and the distance between adjacent primitive lights 110 may be about 1:1 to about 1:10. When the ratio between the distance between adjacent projection lights 120 and the distance between adjacent primitive lights 110 is increased by the lens 322, the resolution of the exposure apparatus may be increased. In this manner, however, exposure errors may be increased, such that the preciseness of the exposure apparatus may be decreased. As such, pulse event generation (PEG) may be utilized and controlled (e.g., optimized) so that exposure errors may be reduced and preciseness may be increased. Pulse event generation is described in more detail in association with FIGS. 8 and 9A to 9I. In exemplary embodiments, the ratio between the distance between adjacent projection lights 120 and the distance between adjacent primitive lights 110 may be about 1:4.

According to exemplary embodiments, the projecting member 300 may also be configured to control the projection light 120 so that light having various cross-sectional shapes may be projected even though the same mask 310 is used. Further, the plurality of radiation events (or exposures) through the various sets of first points 422, which may overlap various areas of the photoresist, may be utilized to form the photoresist pattern 440. These multiple radiation events may be utilized to decrease exposure errors, and, thereby, increase preciseness of the exposure apparatus.

Figure 7B:
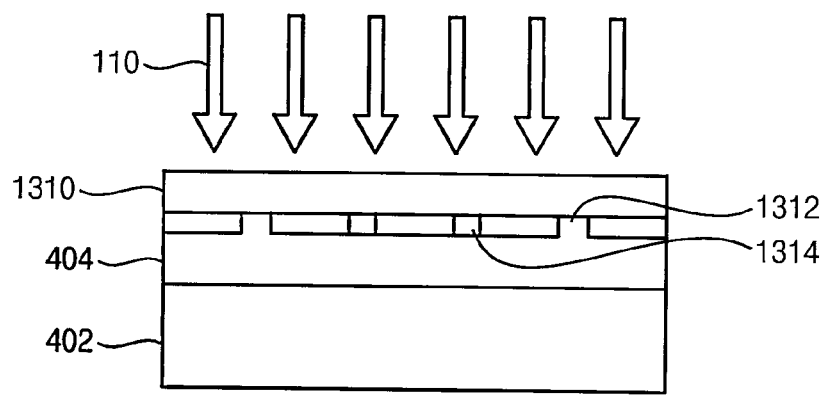
FIG. 7B schematically illustrates an exposure method, according to exemplary embodiments.

FIG. 7B schematically illustrates an exposure method, according to exemplary embodiments. The exposure apparatus of FIG. 7B is substantially similar to the exposure apparatus of FIG. 7A. As such, primarily differences are provided below to avoid obscuring exemplary embodiments illustrated in FIG. 7B and described herein.

Referring to FIG. 7B, the exposure apparatus does not include the projector 320 or the lens 322. It is noted, however, that the exposure apparatus of FIG. 7B may control light propagating towards photoresist 404 using patterns 1312 and 1314 of a mask 1310.

According to exemplary embodiments, the mask 1310 may make contact with the photoresist 404 during exposure. The mask 1310 may include a transparent pattern 1312 and a light blocking pattern 1314. The transparent pattern 1312 may be configured to transmit the light, whereas the light blocking pattern 1314 may be configured to block the light. It is noted that when the primitive light 110 passes through the transparent pattern 1312, it is radiated onto the photoresist pattern 430 of the photoresist 404. To this end, the mask 1310 may be replaced with respect to the photoresist pattern 430. Also, the photoresist pattern 430 may be formed by a single exposure. Yield may be decreased a result of exposure errors during an exposure time.

Figure 7C:
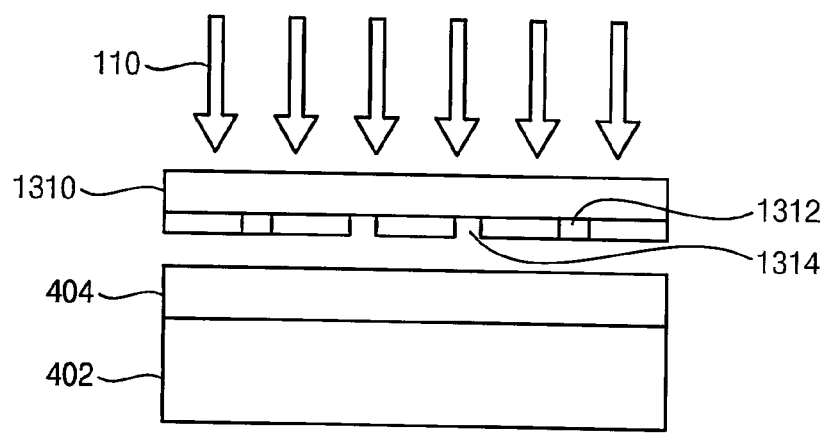
FIG. 7C schematically illustrates an exposure method, according to exemplary embodiments.

FIG. 7C schematically illustrates an exposure method, according to exemplary embodiments. The exposure apparatus of FIG. 7C may be substantially similar to the exposure apparatus of FIG. 7B except for the disposition of the mask 1310. As such, repetitive explanations have been omitted to avoid obscuring exemplary embodiments described herein.

Referring to FIG. 7C, the mask 1310 may be spaced apart from the photoresist 404 during an exposure time. When a distance between the mask 1310 and the photoresist 404 is decreased, resolution of the photoresist pattern 430 may be increased. It is noted, however, that the mask 1310 may be polluted (or otherwise adversely affected) when in contact with the photoresist 404. As such, the mask 1310 may be spaced apart from the photoresist 404 to prevent pollution (or other adverse effects) associated with the contact of the mask 1310 with the photoresist 404. This may increase the lifetime of the mask 1310. The mask 1310, however, may be disposed relatively close to the photoresist 404 to increase the resolution, and, thereby, yield of the exposure apparatus.

Figure 8:
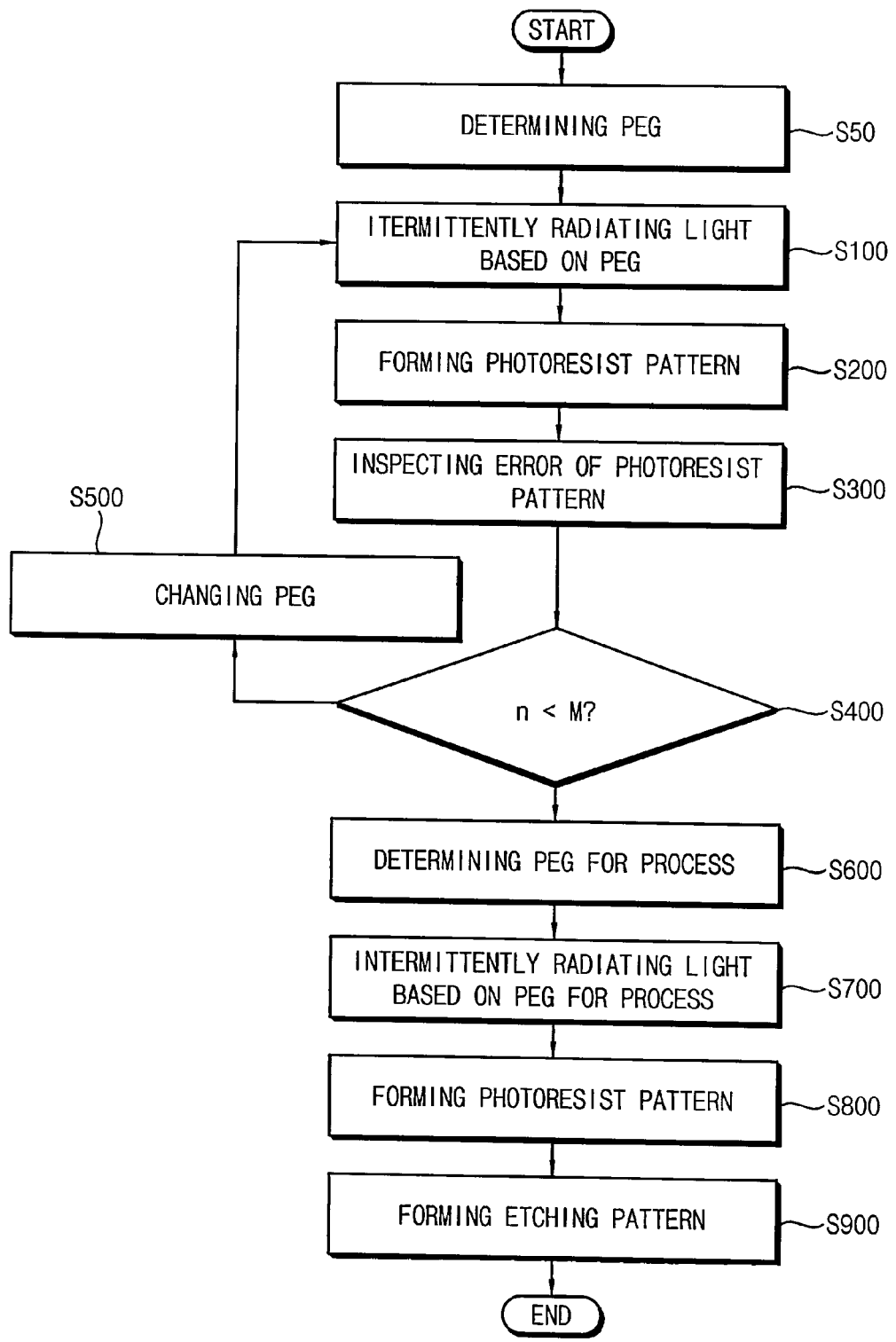
FIG. 8 is a flowchart of an exposure method using the exposure apparatus of FIG. 1, according to exemplary embodiments.

FIG. 8 is a flowchart of an exposure method using the exposure apparatus of FIG. 1, according to exemplary embodiments. FIGS. 9A to 9I are respective plan views schematically illustrating an intermittently radiated light associated with a pulse event generation (PEG) technique of the exposure method of FIG. 8.

Figure 9A:
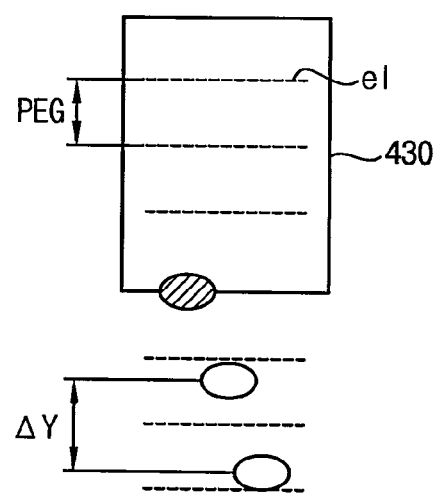
FIGS. 9A to 9I are respective plan views schematically illustrating an intermittently radiated light associated with a pulse event generation (PEG) technique of the exposure method of FIG. 8, according to exemplary embodiments.

Referring to FIGS. 1, 8 and 9A, a pulse event generation (PEG) technique is determined (step S50) for intermittent propagation of light towards a target substrate. In this manner, the pulse event generation (PEG) may represent a period of light radiation. To this end, the pulse event generation (PEG) may correspond to an on/off period of the digital micromirror device (DMD). It is noted that exposure quality may be represented by critical dimension (CD), critical dimension uniformity (CDU), line edge roughness (LER), etc. The critical dimension (CD) may be changed (or otherwise controlled) by an angle of a photoresist pattern 440. In this manner, when a photoresist pattern 440 is formed using a projecting member 300, uniformity of a projection light 120 may be decreased. That is, when a projection light 120 having a higher resolution than a primitive light 110 is formed using a lens 322, the uniformity of the projection light 120 may be decreased as the resolution is increased.

TABLE 1

| Parameter | | | Horizontal Line (Parallel with Scan Line 410) | | | Vertical Line (Perpendicular to Scan Line 410) | | | Diagonal Line (+45, −45 with Respect to Scan Line 410) | | |
|---|---|---|---|---|---|---|---|---|---|---|---|
| | | | CD | CDU | LER | CD | CDU | LER | CD | CDU | LER |
| Beam Position | Placement Error | Systematic | | Δ | ○ | | Δ | | | | Δ |
| | | Random | | ○ | ⊚ | | ○ | | | | ○ |
| | Measurement Uncertainty | | ○ | ⊚ | ⊚ | ○ | ⊚ | | ○ | Δ | ⊚ |
| K value (Constant based on Gradient of DMD) | | | ○ | Δ | ⊚ | Δ | ⊚ | | | | |
| PEG (Pulse Event Generation) | | | ⊚ | ○ | ⊚ | | | ⊚ | | ○ | ⊚ |
| Dose Compensation from Beam Power Distribution | | | | ⊚ | | | | ⊚ | | | |
| Dark Defect | | | | ⊚ | | | ⊚ | Δ | | | |
| Spot Beam | Mean Size | | ⊚ | ○ | ⊚ | | ⊚ | | ⊚ | | Δ |
| | Size Variation over Field | | | ⊚ | ○ | | ⊚ | Δ | | | |
| | Ellipticity | | ○ | | | ○ | | | | ⊚ | |
| Autofocus (& Stage Flatness) | | | ⊚ | ⊚ | Δ | ⊚ | ⊚ | | | | |
| Field Flatness (or DOF) of Optical Head | | | | ○ | | | ○ | | | | ○ |
| Stage Motion Straightness | | | | | | Δ | Δ | Δ | | ○ | Δ |
| Spot Pitch | | | | Δ | ⊚ | Δ | Δ | | | ○ | Δ |

Parameters associated with the exposure quality may include placement error of beam position, measurement uncertainty, K value (a constant based on the gradient of the digital micromirror device (DMD)), pulse event generation (PEG), dose compensation from beam power distribution, dark defect, mean size of each first point 422, size variation of the first points 422 over an exposure field, ellipticity of the first points 422, autofocus and stage flatness of the stage 400, depth of focus (DOF), stage motion straightness, spot pitch, etc.

Table 1 provides a relationship between the exposure quality and related parameters. It is noted that in Table 1, ⊚ represents a very high degree of relationship between the exposure quality and an associated parameter, whereas the ○ represents a slightly high degree of relationship between the exposure quality and the associated parameter. Further, the Δ represents a small degree of relationship between the exposure quality and the associated parameter.

The CD may be changed based on various parameters such as width, shape, height, etc. As such, CD may not be suitable for quantitative analysis of the exposure quality. It is also noted that any parameter related to the CD in various directions may not be found.

The CDU may be changed based on the width of the CD that is changed based on the various parameters noted above. In this manner, the CDU may also not be suitable for quantitative analysis of the exposure quality.

The degree of change of the LER based on the width, shape, height, etc., of the pattern may be smaller than the CD. Also, the LER may be highly related to the PEG in the horizontal direction, the vertical direction, and a diagonal direction, e.g., a +45 degree or −45 degree direction. It is contemplated, however, that the CD or the CDU may not be excluded in exemplary embodiments. Even still, the LER may be more suitable than the CD and the CDU for analysis of the exposure quality.

Equation 1 represents a function of the line edge distance (LE) based on radiating interval ΔY and the PEG.

$$LE = MOD(n \times \Delta Y, PEG) \quad \text{Equation 1}$$

Figure 9B:
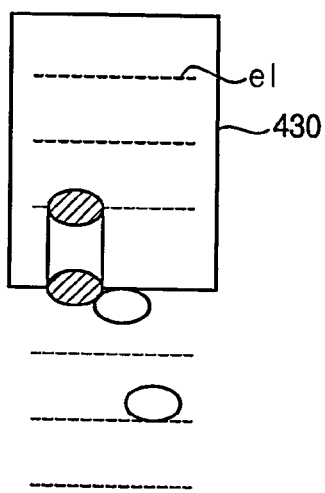
Figure 9C:
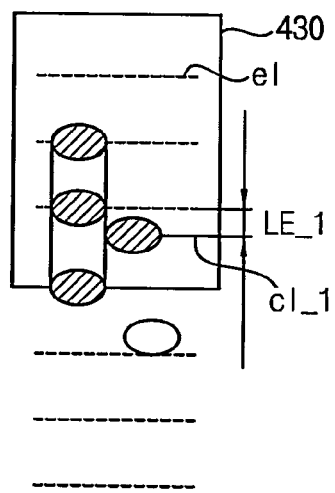
Figure 9D:
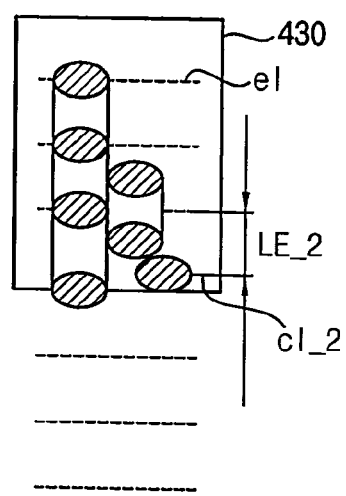
Figure 9E:
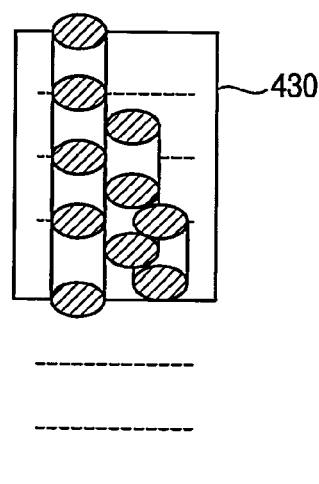
Figure 9F:
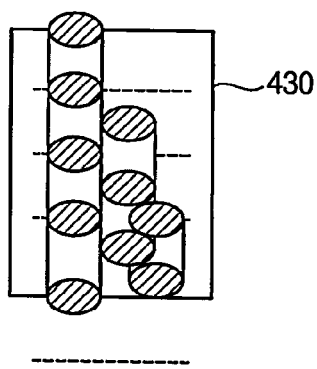
Figure 9G:
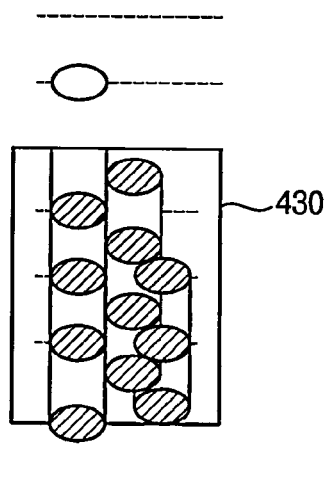
Figure 9H:
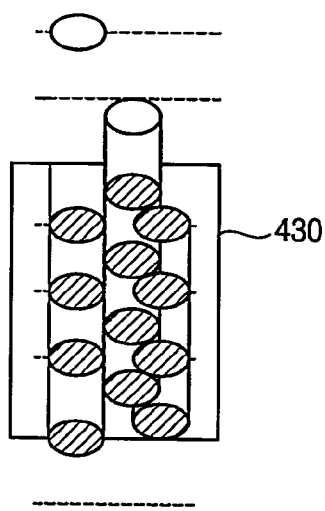
Figure 9I:
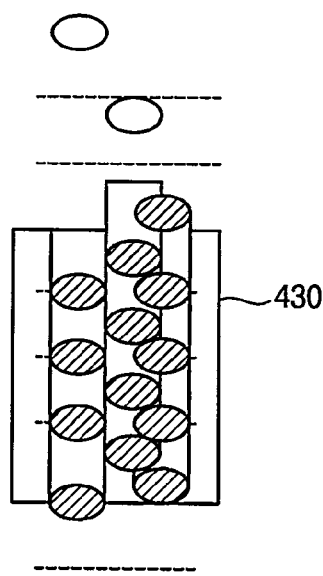

The line edge distance represents a distance between a line edge el and a first central line cl_1 of FIG. 9C and a second central line cl_2 of FIG. 9D. The radiating interval ΔY represents a distance between adjacent first points 422 with respect to a direction substantially perpendicular to the scan line 410. MOD represents a mathematical operator obtaining a remainder. For example, MOD (3, 2) represents a remainder 1 that is obtained when 3 is divided by 2.

Equation 2 represents a relationship between the radiating interval ΔY and the PEG.

$$\Delta Y / PEG = M + \alpha \quad \text{Equation 2}$$

M represents an integer and α represents a number greater than or equal to 0, but less than 1.

Equation 1 may be combined with Equation 2 to form Equation 3

$$LE = MOD(n \times M + n \times \alpha, 1) \times PEG \quad \text{Equation 3}$$

It is noted that n and M are integers. Equation 3 may be rearranged to form Equation 4.

$$LE = MOD(n \times \alpha, 1) \times PEG \quad \text{Equation 4}$$

Equation 4 may be combined with Equation 2 to form Equation 5.

$$LE = MOD\{n \times MOD(\Delta Y / PEG, 1), 1\} \times PEG \quad \text{Equation 5}$$

Both sides of Equation 5 may be divided by the PEG to form Equation 6.

$$LE/PEG = MOD\{n \times MOD(\Delta Y / PEG, 1), 1\} \quad \text{Equation 6}$$

The left side of Equation 6, i.e., LE/PEG, represents a normalization of the LE by the PEG. In right side of Equation 6, ΔY/PEG represents the radiation interval ΔY divided by the PEG. That is, the normalized value of the LE by the PEG equals a decimal place of the radiation interval ΔY divided by the PEG. In this manner, Equation 6 demonstrates that the LE may be represented by a function of the PEG and the radiation interval ΔY.

Light is intermittently radiated onto a photoresist 404 of the stage 400 based on the PEG (step S100).

Referring again to FIGS. 5, 6A, and 9A, when a through hole 311 of the mask 310 is arranged in the photoresist shape 430, light is radiated onto a first point 422 (illustrated as a dark ellipse in FIG. 9A) of a 0-th line. The second points 424 (illustrated as the bright ellipses of FIG. 9A) of first and second lines are not disposed in the photoresist shape 430. In this manner, the light may not be radiated onto the second points 424 of the first and second lines.

Referring to FIGS. 5, 6A, and 9B, the mask 310 may be shifted in the direction substantially perpendicular to the scan line 410 by the PEG. The light is radiated onto two first points 422 (illustrated as dark ellipses of FIG. 9B) of the 0-th line through the through holes 311 of the mask 310 disposed in the photoresist shape 430. The second points 424 (illustrated as bright ellipses of FIG. 9B) in the first and second lines are not disposed in the photoresist shape 430. In this manner, the light may not be radiated onto the second points 422 in the first and second lines.

Referring to FIGS. 5, 6A, and 9C, the mask 310 may be further shifted in the direction substantially perpendicular to the scan line 410 by the PEG. The light may be radiated onto three first points 422 (illustrated as dark ellipses along a left line of FIG. 9C) of the 0-th line and one first point 422 (illustrated as a dark ellipse along a central line of FIG. 9C) of the first and second lines. The second point 424 (illustrated as a bright ellipse of FIG. 9C) in the second line is not disposed in the photoresist shape 430. In this manner, the light may not be radiated onto the second point 424 in the second line.

A distance between the line edge el and the first central line cl_1 (shown in FIG. 9C) of the first point 422 (illustrated as a dark ellipse of the first central line cl_1 of FIG. 9C) of the first line is substantially equal to a first line edge length LE_1. The first line edge length LE_1 may be obtained from Equation 5 by substituting n with 1.

Referring to FIGS. 5, 6A, 9D, the mask 310 may be further shifted in the direction substantially perpendicular to the scan line 410 by the PEG. The light may be radiated onto four first points 422 (illustrated as dark ellipses along a left line of FIG. 9D) of the 0-th line, two first points 422 (illustrated as dark ellipses along a central line of FIG. 9D) of the first line, and one first point 422 (illustrated as a dark ellipse along a right line of FIG. 9D) of the second line.

A distance between the line edge el and the second central line cl_2 (shown in FIG. 9D) of the first point 422 (illustrated as a dark ellipse of the right line of FIG. 9D) of the second line may be substantially equal to a second line edge length LE_2. The second line edge length LE_2 may be obtained from Equation 5 by substituting n with 2.

Referring to FIGS. 5, 6A, and 9E to 9I, the mask 310 may be repetitively shifted in the direction substantially perpendicular to the scan line 410 by the PEG. The light may be radiated onto the first points 422 of the 0-th to second lines through the through holes 311 disposed in the photoresist shape 430 of the mask 310. The shift of the mask 310 may represent a relative movement between the mask 310 and the stage 400. Alternatively, only the stage 400 may be physically shifted.

Referring again to FIGS. 6C and 8, the exposed photoresist 404 is developed to form a photoresist pattern 440 (step S200).

Figure 10A:
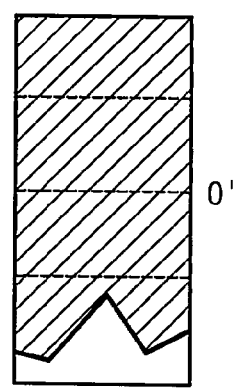
FIGS. 10A to 10C are respective plan views schematically illustrating photoresist shapes and photoresist patterns extended in various directions formed according to the exposure method of FIG. 8, according to exemplary embodiments.
Figure 10B:
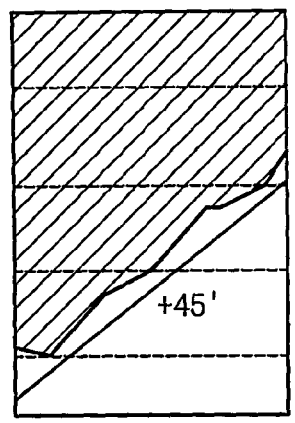
Figure 10C:
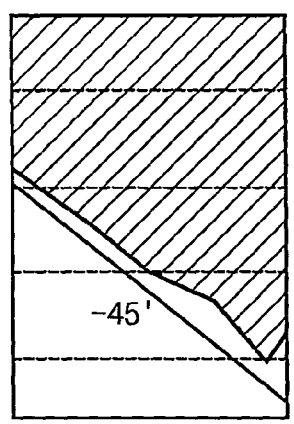

FIGS. 10A to 10C are respective plan views schematically illustrating photoresist shapes and photoresist patterns extended in various directions formed according to the exposure method of FIG. 8, according to exemplary embodiments. In FIGS. 10A to 10C, a straight line represents the photoresist shape 430 (shown in FIG. 6A), and a broken line represents the photoresist pattern 440 (shown in FIG. 6C).

Referring to FIGS. 10A to 10C, error in the photoresist pattern 440 may be inspected by the inspecting member 800 (step S300).

Referring again to FIGS. 6A to 6C and 10A, when the photoresist shape 430 is aligned in a direction substantially parallel with a transportation direction of the mask 310, the direction of the photoresist shape 430 is set to be 0 degrees. When the direction of the photoresist shape 430 is the 0 degree direction, the photoresist pattern 440 is substantially the same as the photoresist shape 430. When the photoresist pattern 440 is substantially the same as the photoresist shape 430, the CD may be uniform regardless of the LE.

When the photoresist shape 430 is substantially perpendicular to the transportation direction of the mask 310, the direction of the photoresist shape 430 may be set to be 90 degrees. When the direction of the photoresist shape 430 is the 90 degree direction, a shape of the photoresist pattern 440 may be substantially the same as a distribution of the LE, and the photoresist pattern 440 may be different from the photoresist shape 430. However, the distribution of the LE may be constant based on the n value. In this manner, the photoresist pattern 440 may be controlled by controlling the PEG based on Equation 6.

Referring to FIGS. 6A to 6C and 10B, when the photoresist shape 430 is aligned to form +45 degrees with respect to the transportation direction of the mask 310, the shape of the photoresist pattern 440 may be changed by the distribution of the LE by about +45 degrees. In this manner, the photoresist pattern 440 may be different from the photoresist shape 430. It is noted, however, that the distribution of the LE may be constant based on the n value, such that the photoresist pattern 440 may be controlled by controlling the PEG based on Equation 6.

Referring to FIGS. 6A to 6C and 10C, when the photoresist shape 430 is aligned to form −45 degrees with respect to the transportation direction of the mask 310, the shape of the photoresist pattern 440 may be changed by the distribution of the LE by about −45 degrees. In this manner, the photoresist pattern 440 may be different from the photoresist shape 430. It is noted, however, that the distribution of the LE may be constant based on the n value, such that the photoresist pattern 440 may be controlled by controlling the PEG based on Equation 6.

Figure 11:
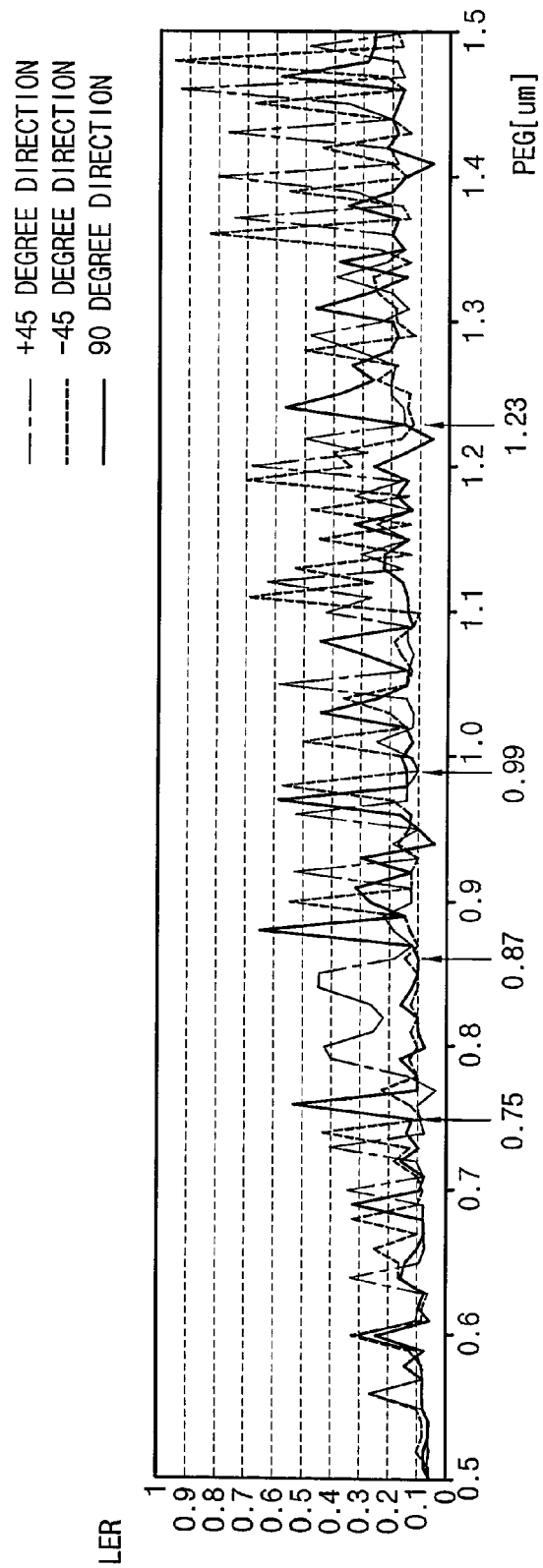
FIG. 11 is a graph for determining a pulse event generation (PEG) according to the exposure method of FIG. 8, according to exemplary embodiments.

To make the photoresist pattern 440 be substantially the same as the photoresist shape 430 in various directions, the PEG may be determined by following method described in association with FIG. 11.

FIG. 11 is a graph for determining a pulse event generation (PEG) according to the exposure method of FIG. 8, according to exemplary embodiments. In FIG. 11, the horizontal axis represents the PEG, and vertical axis represents the LER. The LER may be increased with the normalized value of the LE by the PEG.

Referring to FIGS. 8 and 11, a distribution n of the LER may be inspected (e.g., via the inspection member 800) to be disposed in a reference value M (step S400).

As seen in FIG. 11, the LER was tested based on various PERs between 0.5 μm to 1.5 μm. The LER was inspected in the 90 degree direction, the +45 degree direction, and the −45 degree direction. When the distribution n of the LER was out of the reference value M, the PER was changed (step S500) to repeatedly test the changed LER. The PEGs satisfying a 1 sigma distribution of the LER were 0.67 μm, 0.71 μm, 0.75 μm, 0.87 μm, 0.99 μm, 1 μm, and 1.23 μm. The PEGs satisfying a 1.2 sigma distribution of the LER were 0.87 μm, 0.99 μm, and 1.23 μm.

According to exemplary embodiments, the information processing member 600 may analyze a plurality of different photoresist patterns 430 corresponding to a plurality of different PEGs to determine one of the different PEGs that corresponds to a minimum error in the various directions. The determined PEG may be utilized to conduct an exposed process to form an intended pattern (step S600). The minimum error may be a minimum value among a plurality of errors or a determined deviation value. If, for example, the reference value M is 1.2 sigma, the determined PEG may be set to be one of 0.87 μm, 0.99 μm or 1.23 μm. It is noted that the value having the least amount of error may be set to be the PEG for process. For example, the PEG for process may be set to be 0.99 μm (step S600). In this manner, the PEG for process may be selected from various PEGs so that the photoresist pattern 440 may be substantially the same as the photoresist shape 430.

The light may be intermittently radiated onto the photoresist 404 by the determined PEG for process (step S700). The final photoresist pattern 440 may be formed on the base substrate 402 (step S800). An etching pattern may be formed using the final photoresist pattern 440 as an etching mask (step S900).

Figure 12A:
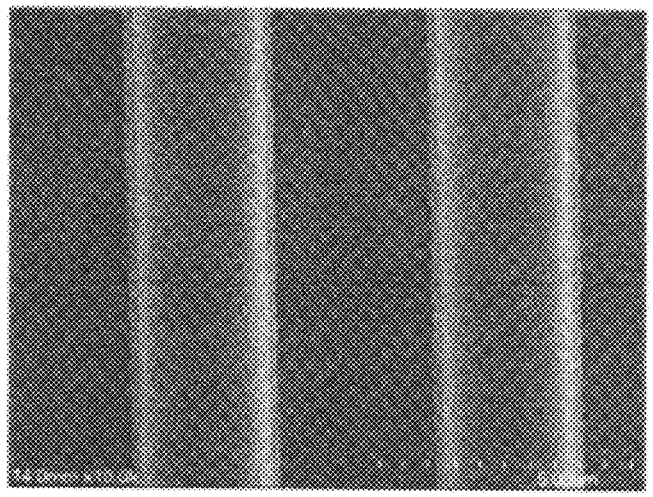
FIGS. 12A to 12C are respective images of photoresist patterns formed using a conventional exposure method.
Figure 12B:
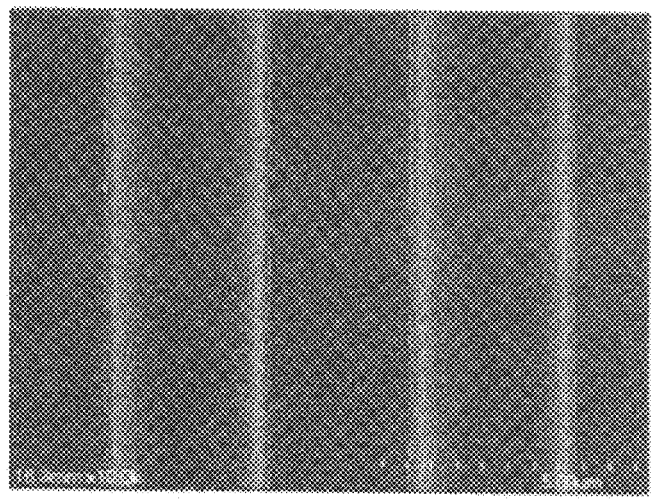
Figure 12C:
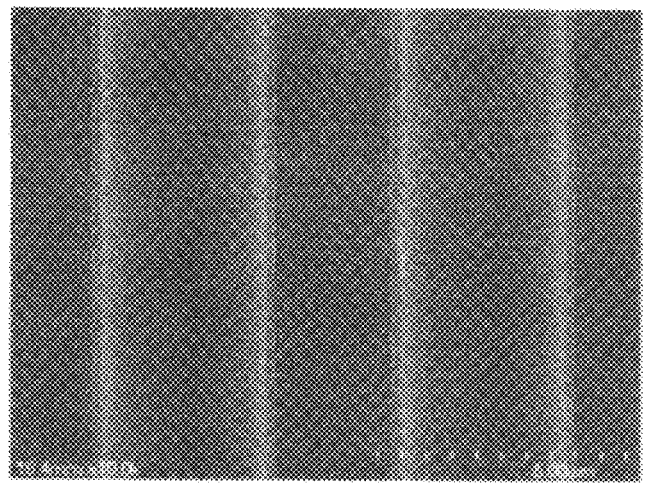

FIGS. 12A to 12C are respective images of photoresist patterns formed using a conventional exposure method. In FIGS. 12A to 12C, a photoresist pattern corresponding to a photoresist shape having a width of 3 μm is formed using an exposure apparatus of SOP-502 produced by Canon Co., Ltd., Japan.

Referring to FIG. 12A, a CD of a photoresist pattern corresponding to a photoresist shape extended in a vertical direction having a width of 3 μm was about 2.96 μm to about 3.12 μm. Variation of the CD in the vertical direction was about 0.16 μm (i.e., 3.12 μm-2.96 μm).

Referring to FIG. 12B, a CD of a photoresist pattern corresponding to a photoresist shape extended in a +45 degree direction having a width of 3 μm was about 2.59 μm to about 3.42 μm. Variation of the CD in the +45 degree direction was about 0.83 μm (i.e., 3.42 μm-2.59 μm).

Referring to FIG. 12C, a CD of a photoresist pattern corresponding to a photoresist shape extended in a −45 degree direction having a width of 3 μm was about 2.05 μm to about 3.94 μm. Variation of the CD in the −45 degree direction was about 1.89 μm (i.e., 3.94 μm-2.05 μm).

As can be appreciated from the above, the CD in the vertical direction was substantially equal to the photoresist shape; however, when the direction of the CD was changed, the variation of the CD was increased. In particular, the variation in the −45 degree direction was the greatest.

Figure 13:
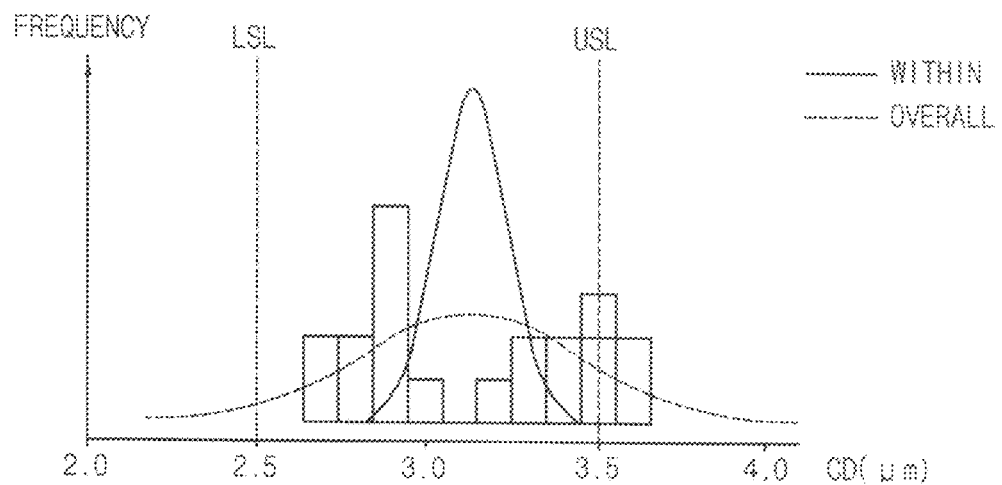
FIG. 13 is a graph of a process capability for the patterns of FIGS. 12A to 12C.

FIG. 13 is a graph of a process capability for the patterns of FIGS. 12A to 12C. In FIG. 13, a horizontal axis represents a CD in a μm unit and a vertical axis represents frequency of the CD. A lower specification limit (LSL) was about 2.5 μm and an upper specification limit (USL) was about 3.5 μm.

Referring to FIG. 13, the variation of the CD of the photoresist patterns corresponding to the photoresist shapes having the width of about 3 μm and arranged in various directions were relatively high. That is, a lot of the CDs were disposed outside of the upper specification limit (USL). A process capability index (CPK) used for determining if the product is disposed within the graph to have an acceptable quality was about 0.38.

Figure 14A:
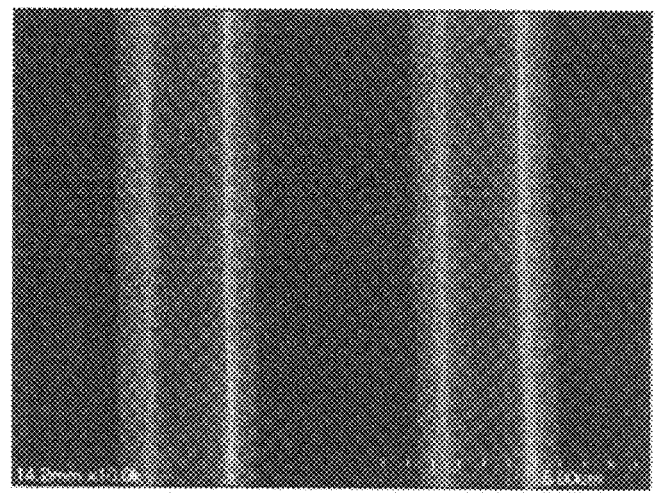
FIGS. 14A to 14C are respective images of photoresist patterns formed using the exposure method of FIG. 8, according to exemplary embodiments.
Figure 14B:
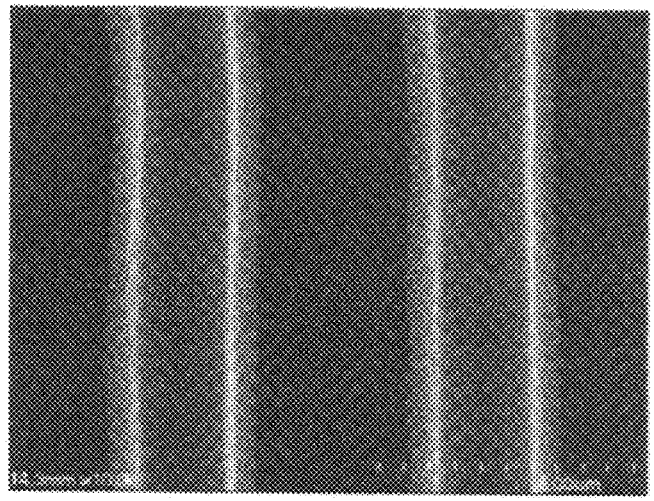
Figure 14C:
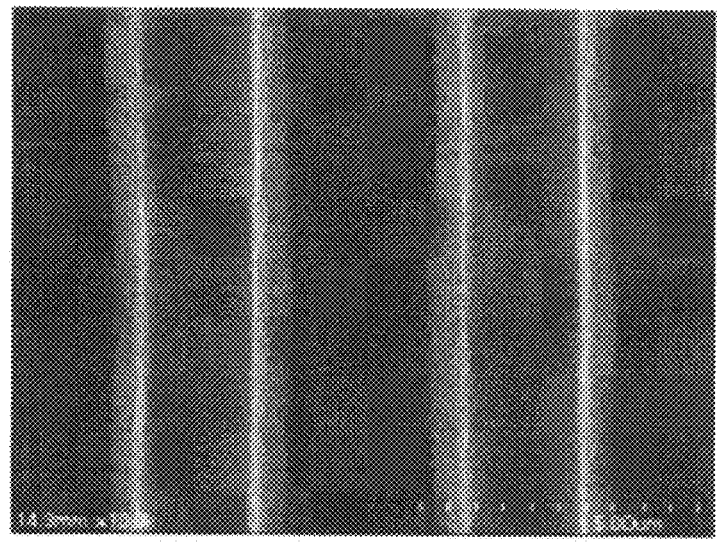
Figure 15A:
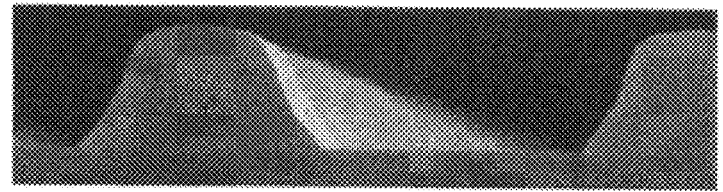
FIGS. 15A to 15C are respective cross-sectional images of the photoresist patterns of FIGS. 14A to 14C, according to exemplary embodiments.
Figure 15B:
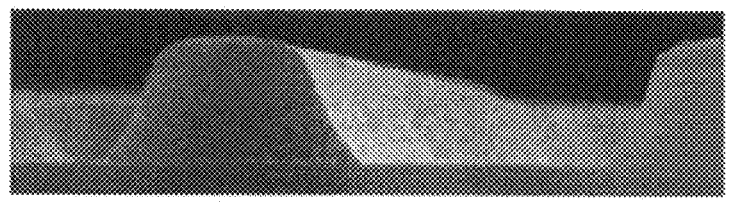
Figure 15C:
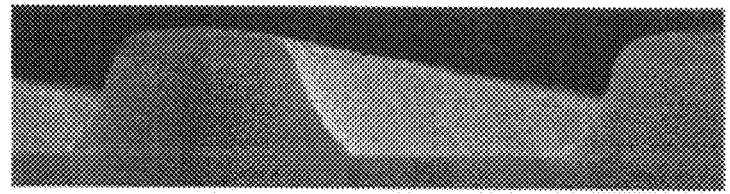
Figure 16:
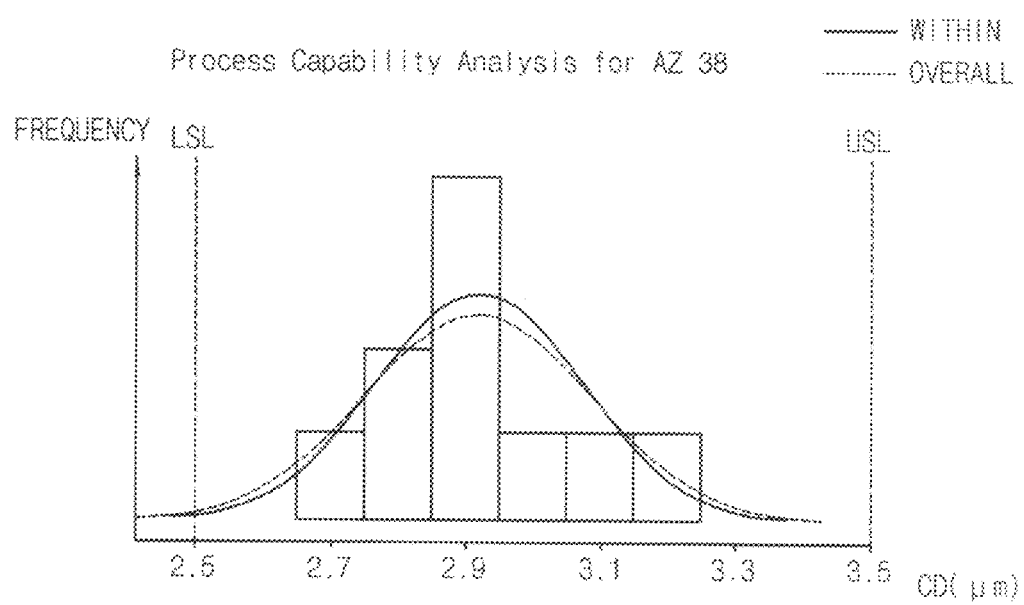
FIG. 16 is a graph of a process capability for the patterns of FIGS. 15A to 15C, according to exemplary embodiments.

FIGS. 14A to 14C are respective images of photoresist patterns formed using the exposure method of FIG. 8, according to exemplary embodiments. FIGS. 15A to 15C are respective cross-sectional images of the photoresist patterns of FIGS. 14A to 14C. FIG. 16 is a graph of a process capability of the patterns of FIGS. 15A to 15C. A photoresist pattern corresponding to a photoresist shape having a width of about 3 μm was formed using the exposure apparatus of FIG. 1 with a PEG of about 0.99 μm. Results are represented as AZ 38 in FIG. 16, as will become more apparent below.

Referring to FIGS. 14A and 15A, a CD of the photoresist pattern corresponding to a photoresist shape extended in a vertical direction having a width of about 3 μm was about 2.93 μm to about 3.11 μm. Variation of the CD in the vertical direction was about 0.18 μm (i.e., 3.11 μm-2.93 μm). Although the variation of FIGS. 14A and 15A were greater than the variation 0.16 μm of FIG. 12A, the difference is still within a measurement error. As such, the variation of the CD according to exemplary embodiments in the vertical direction were similar to the variation associated with FIG. 12A.

Referring to FIGS. 14B and 15B, a CD of the photoresist pattern corresponding to a photoresist shape extended in a +45 degree direction having a width of about 3 μm was about 2.76 μm to about 3.35 μm. Variation of the CD was about 0.59 μm (i.e., 3.35 μm-2.76 μm). The variation of FIGS. 14B and 15B is smaller than the variation 0.83 μm of FIG. 12B by about 33%.

Referring to FIGS. 14C and 15C, a CD of the photoresist pattern corresponding to a photoresist shape extended in a −45 degree direction having a width of about 3 μm was about 2.42 μm to about 3.58 μm. Variation of the CD was about 1.16 μm (i.e., 3.58 μm-2.42 μm). The variation of FIGS. 14C and 15C is smaller than the variation 1.89 μm of FIG. 12C by about 39%.

According to exemplary embodiments, the CD in the vertical direction has substantially the same variation as the CD of FIG. 12A. It is noted, however, that the CD in the +45 degree direction and the −45 degree direction were decreased by about 33% and 39%, respectively.

Adverting to FIG. 16, a horizontal axis represents a CD in a μm unit and a vertical axis represents frequency of the CD. A lower specification limit (LSL) was about 2.5 μm and an upper specification limit (USL) was about 3.5 μm. As seen in FIG. 16, variation of the CD of the photoresist pattern corresponding to the photoresist shape arranged in various directions and having the width of about 3 μm was decreased. The CD disposed out of the lower specification limit (LSL) or the upper specification limit (USL) was few. A CPK index used for determining if the product was disposed within the graph to have an acceptable quality was about 0.88. The CPK of FIG. 16 is increased by about 132% as compared to the CPK of 0.38 of FIG. 13.

Figure 17A:
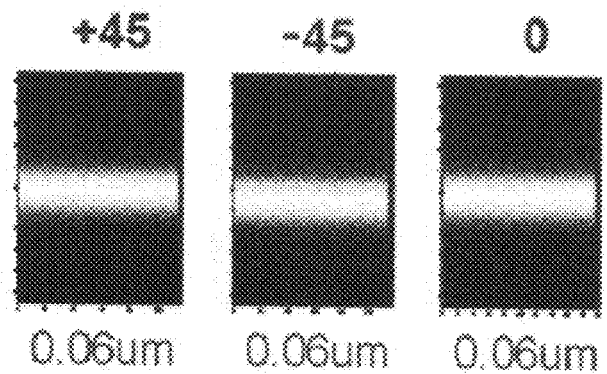
FIG. 17A is an image of a beam size corresponding to a beam spot when a pulse event generation is 0.50 μm, according to exemplary embodiments.

FIG. 17A is an image of a beam size corresponding to a beam spot when a pulse event generation is 0.50 μm, according to exemplary embodiments.

Referring to FIGS. 6A and 17A, a beam size corresponding to the first points 422 was about 0.06 μm in the +45 degree direction, the −45 degree direction, and a vertical direction.

Figure 17B:
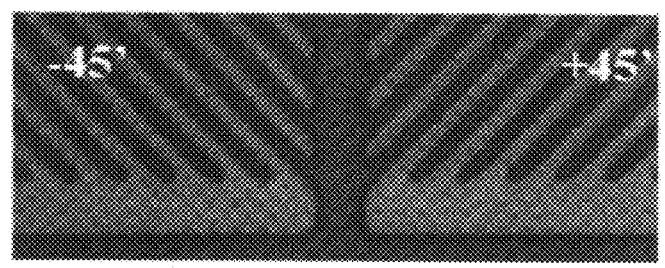
FIG. 17B is an image of photoresist patterns formed using the exposure beam of FIG. 17A, according to exemplary embodiments.
Figure 17C:
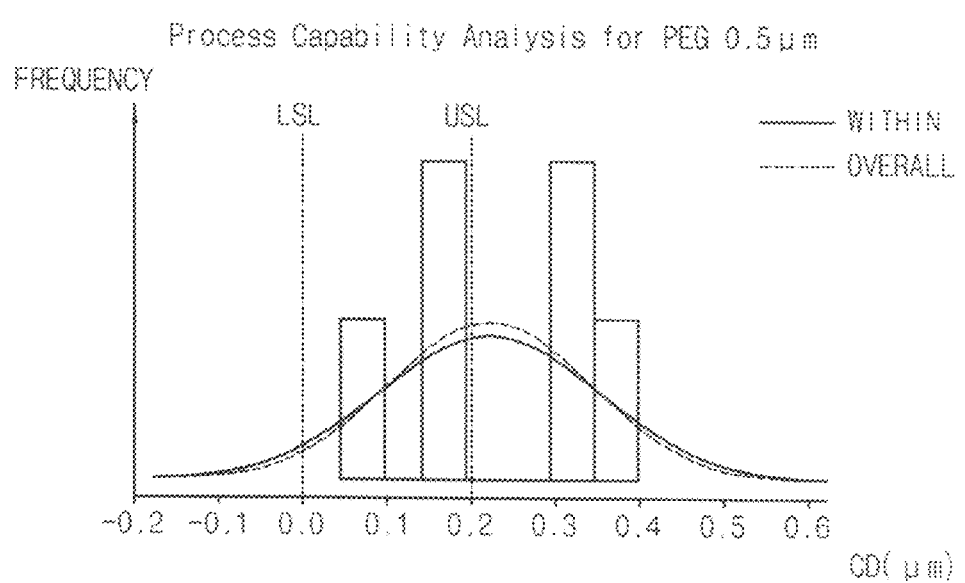
FIG. 17C is a graph of a process capability for the patterns of FIG. 17B, according to exemplary embodiments.

FIG. 17B is an image of photoresist patterns formed using the exposure beam of FIG. 17A, according to exemplary embodiments. FIG. 17C is a graph of a process capability for the patterns of FIG. 17B. Photo sensitivity (EOP) was about 30 mJ and the PEG was about 0.50 μm.

Referring to FIGS. 17B and 17C, a minimum value of the CD, a maximum value of the CD, and a mean value of the CD in the +45 degree direction were 0.07 μm, 0.37 μm, and 0.27 μm, respectively. A minimum value of the CD, a maximum value of the CD, and a mean value of the CD in the −45 degree direction were 0.15 μm, 0.30 μm, and 0.20 μm, respectively. Deviation of the CDs in the different directions was 0.06 μm (i.e., 0.26 μm-0.20 μm).

According to exemplary embodiments, a lower specification limit (LSL) and an upper specification limit (USL) were 0 μm and 0.2 μm, respectively. The lower specification limit (LSL) was 0 μm, such that no CD was out of the lower specification limit (LSL). A number of CDs were out of the upper specification limit (USL). A process capability index (CPK) used for determining if the product was disposed within the graph to have an acceptable quality was about −0.06.

Figure 18A:
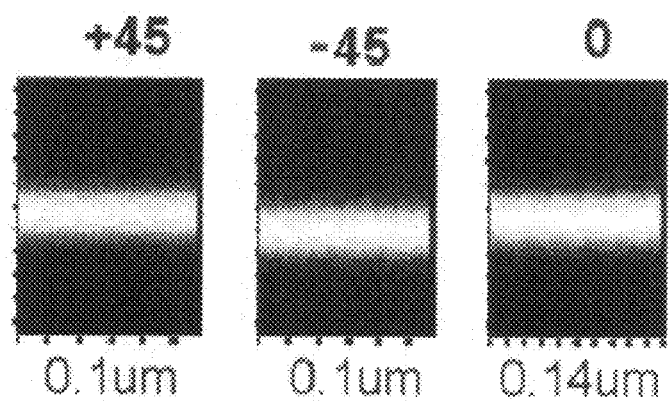
FIG. 18A is an image of a beam size corresponding to a beam spot when a pulse event generation is 0.99 μm, according to exemplary embodiments.

FIG. 18A is an image of a beam size corresponding to a beam spot when a pulse event generation is 0.99 μm, according to exemplary embodiments.

Referring to FIGS. 6A and 18A, the beam size corresponding to the first points 422 in the +45 degree direction, the −45 degree direction, and the vertical direction were 0.1 μm, 0.1 μm, and 0.14 μm, respectively.

Figure 18B:
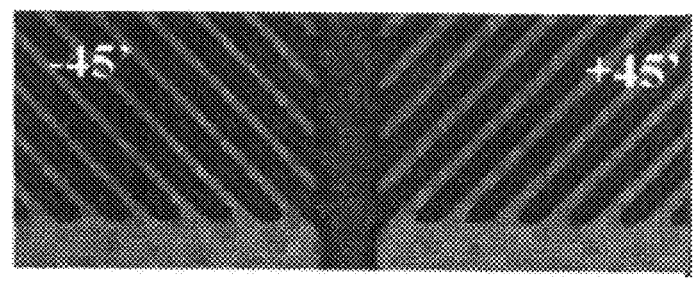
FIG. 18B is an image of patterns formed using the exposure beam of FIG. 18A, according to exemplary embodiments.
Figure 18C:
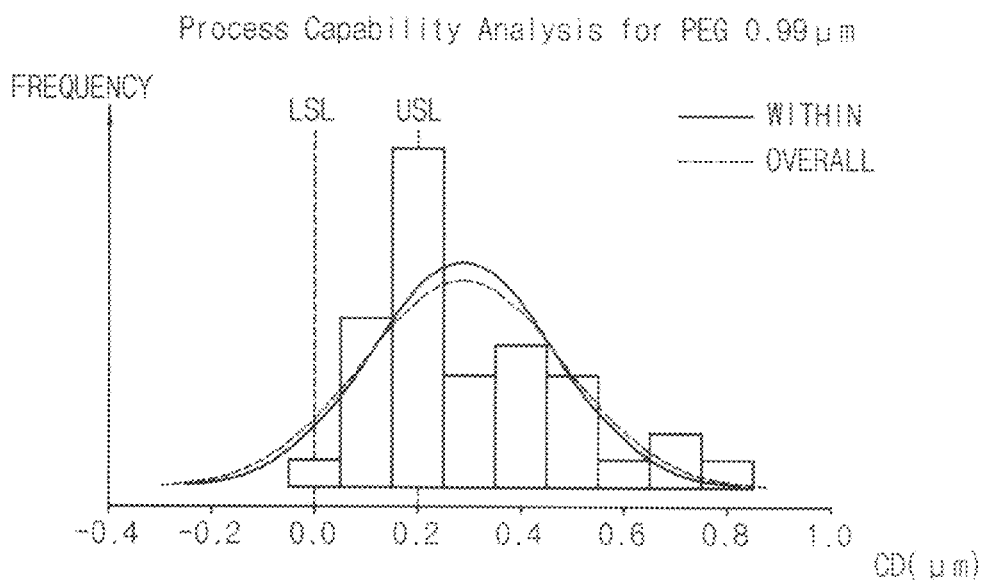
FIG. 18C is a graph of a process capability for the patterns of FIG. 18B, according to exemplary embodiments.

FIG. 18B is an image of patterns formed using the exposure beam of FIG. 18A, according to exemplary embodiments. FIG. 18C is a graph of a process capability for the patterns of FIG. 18B. In FIGS. 18B and 18C, photo sensitivity (EOP) was about 27 mJ and the PEG was about 0.99 μm.

Referring to FIGS. 18B and 18C, a minimum value of the CD, a maximum value of the CD, and a mean value of the CD in the +45 direction were 0.15 μm, 0.30 μm, and 0.23 μm, respectively. Deviation of the CDs in the different directions was 0.03 μm. The deviation of the CDs of FIGS. 18B and 18C was decreased by about 50% as compared with the deviation of the CDs of FIGS. 17B and 17C.

According to exemplary embodiments, a lower specification limit (LSL) and an upper specification limit (USL) were 0 μm and 0.2 μm, respectively. The lower specification limit (LSL) was 0 μm, such that no CD was out of the lower specification limit (LSL). A small portion of the CDs were out of the upper specification limit (USL). A CPK used for determining if the product was disposed within the graph to have an acceptable quality was about −0.15. Although the CPK was slightly increased as compared with FIGS. 17B and 17C, the increment was within a margin of error.

Figure 19A:
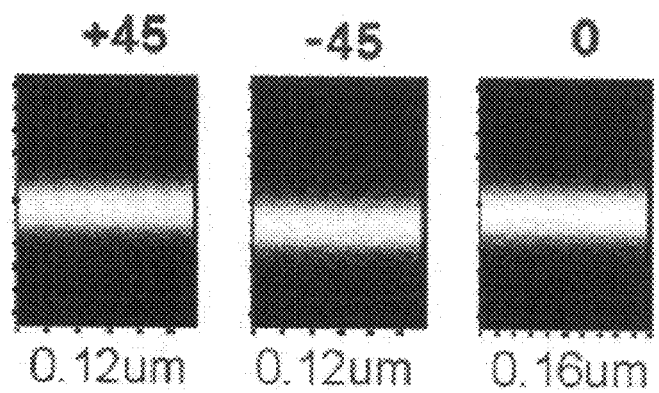
FIG. 19A is an image of a beam size corresponding to a beam spot when a pulse event generation is 1.00 μm, according to exemplary embodiments.

FIG. 19A is an image of a beam size corresponding to a beam spot when a pulse event generation is 1.00 μm, according to exemplary embodiments.

Referring to FIGS. 6A and 19A, the beam size corresponding to the first points 422 in the +45 degree direction, the −45 degree direction, and the vertical direction were 0.12 μm, 0.12 μm, and 0.16 μm, respectively.

Figure 19B:
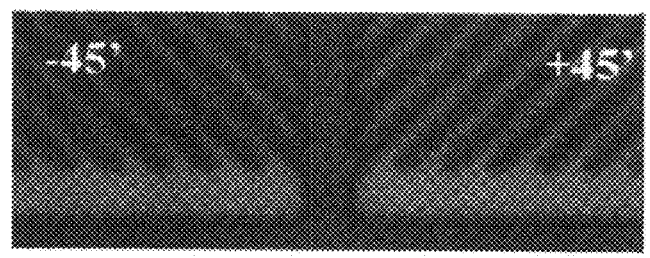
FIG. 19B is an image of patterns formed using the exposure beam of FIG. 19A, according to exemplary embodiments.
Figure 19C:
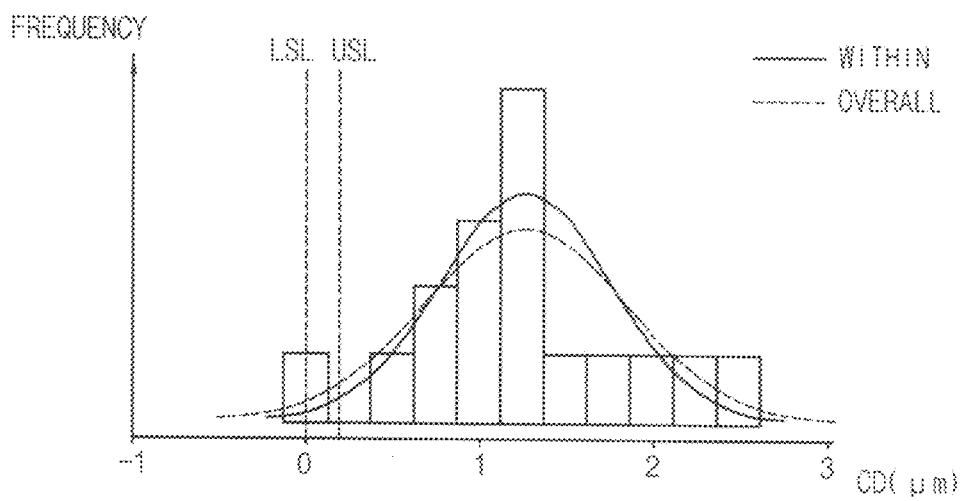
FIG. 19C is a graph of a process capability for the patterns of FIG. 19B, according to exemplary embodiments.

FIG. 19B is an image of patterns formed using the exposure beam of FIG. 19A, according to exemplary embodiments. FIG. 19C is a graph of a process capability for the patterns of FIG. 19B. In FIGS. 19B and 19C, photo sensitivity (EOP) was about 27 mJ and the PEG was about 1.00 μm.

Referring to FIGS. 19B and 19C, a minimum value of the CD, a maximum value of the CD, and a mean value of the CD in the +45 direction were 0.08 μm, 2.22 μm, and 1.15 μm, respectively. In this manner, deviation of the CDs in the different directions was 0.27 μm (i.e., 1.42 μm-1.15 μm). The deviation of the CDs of FIGS. 19B and 19C was decreased by about 800% as compared with the deviation of the CDs of FIGS. 18B and 18C.

According to exemplary embodiments, a lower specification limit (LSL) and an upper specification limit (USL) were 0 μm and 0.2 μm, respectively. The lower specification limit (LSL) was 0 μm, such no CD was out of the lower specification limit (LSL). A number of the CDs were out of the upper specification limit (USL). A CPK used for determining if the product was disposed within the graph to have an acceptable quality was about −0.6. The CPK of FIGS. 19B and 19C was greatly increased as compared with the CPK of FIGS. 18B and 18C, such that the productivity of FIGS. 19B and 19C was greatly decreased as compared with the productivity of FIGS. 18B and 18C.

When the result of FIGS. 18A to 18C are compared with the results of FIGS. 17A to 17C, the PEG was increased by about twice, the difference between the CDs was greatly decreased, and the productivity was slightly increased. When the result of FIGS. 19A to 19C are compared with the results of FIGS. 18A to 18C, the PEG was slightly increased by about 0.01 µm, the difference between the CDs was greatly increased, and the productivity was greatly decreased.

According to exemplary embodiments, the photoresist pattern is formed using the optimized PEG for process, such that the deviation of the CD and the LER related to the CD are minimized, thereby improving productivity. Also, the PEG is highly related with the deviation of the CD and the LER. In exemplary embodiments, the exposure apparatus may include a digital type apparatus having an optimized exposure condition that includes a PEG. Uniformity of line widths of beams having passed through a projecting member may be increased so that uniformity of line widths of formed patterns may also be increased. In this manner, processing margins may be improved.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An exposure apparatus, comprising:
   a light source configured to provide a light in accordance with a pulse event generation (PEG) representing a period of light radiation;
   an illuminating member configured to change the light into point lights;
   a projecting member configured to project the point lights according to a photoresist shape extending in various directions;
   a stage on which the point lights are projected;
   an inspecting member configured to inspect a photoresist pattern formed by the projected point lights; and
   an information processing member configured to analyze different photoresist patterns corresponding to different PEGs, to select one PEG from the different PEGs, the one PEG being associated with a minimum error in the various directions,
   wherein the information processing member is configured to select the one PEG based on the following equation:

LE/PEG=MOD{$n$×MOD($\Delta Y$/PEG,1),1}; and

LE represents a line edge length of the photoresist pattern, n represents an integer, and $\Delta Y$ represents a radiating interval of the light.

2. The exposure apparatus of claim 1, wherein the light source comprises a laser.

3. The exposure apparatus of claim 1, wherein the illuminating member is optically connected to the light source via a light guide line.

4. The exposure apparatus of claim 3, wherein the illuminating member comprises:
   an attenuator configured to control intensity of light received from the light guide line;
   a homogenizer configured to increase uniformity of light received from the attenuator; and
   a condenser configured to condense light received from the homogenizer.

5. The exposure apparatus of claim 1, wherein the projecting member is configured to control the projection of the light points based on a projection signal of the information processing member.

6. The exposure apparatus of claim 5, wherein the projecting member comprises:
   a mask comprising through holes; and
   a projector configured to control transmission of the point lights towards the stage.

7. The exposure apparatus of claim 6, wherein the projecting member further comprises:
   a lens configured to control spacing between the point lights.

8. The exposure apparatus of claim 7, wherein the lens comprises:
   a convex lens configured to decrease the spacing between adjacent point lights.

9. An exposure method, comprising:
   intermittently providing a first light to a first photoresist layer according to a first pulse event generation (PEG) representing a first period of light radiation;
   developing the first photoresist layer to form a first photoresist pattern;
   inspecting error in the first photoresist pattern in various directions;
   changing the first PEG to a second PEG;
   intermittently providing a second light to a second photoresist layer according to the second PEG;
   developing the second photoresist layer to form a second photoresist pattern;
   inspecting error in the second photoresist pattern in various directions; and
   selecting one PEG from the first PEG and the second PEG,
   wherein the one PEG is associated with the least amount of error between the first PEG and the second PEG,
   wherein:
   each of the first PEG and the second PEG respectively satisfy the following equation:

LE/PEG=MOD{$n$×MOD($\Delta Y$/PEG,1),1};

in association with the first PEG, LE represents a line edge length of the first photoresist pattern, n represents an integer, and $\Delta Y$ represents a radiating interval of the first light; and
   in association with the second PEG, LE represents a line edge length of the second photoresist pattern, n represents an integer, and $\Delta Y$ represents a radiating interval of the second light.

10. The exposure method of claim 9, wherein intermittently providing the first light and the second light comprises:
    allowing a portion of the first light or the second light to be provided on a point when the point is disposed in an intended shape; and
    blocking the portion of the first light or the second light when the point is disposed outside the intended shape.

11. The exposure method of claim 10, wherein intermittently providing the first light and the second light comprises:
    allowing another portion of the first light or the second light to be provided on another point adjacent to the point when the another point is disposed in the intended shape; and
    blocking the another portion of the first light or the second light when the another point is disposed outside of the intended shape.

12. The exposure method of claim 11, wherein intermittently providing the first light or the second light comprises:
    arranging points in a first row adjacent to a second row in which the point and the another point are disposed;
    allowing various portions of the first light or the second light to be provided on the points in the first row when the points are disposed in the intended shape; and blocking various other portions of the first light or the second light when the points in the first row are disposed outside the intended shape.

13. The exposure method of claim 12, wherein:

the points of the first row satisfy the following equation:

$$LE = MOD(n \times \Delta Y, PEG).$$

14. The exposure method of claim 9, wherein intermittently providing the first light and the second light comprises:

generating a light pulse of the first light or the second light;

changing the light pulse into point lights; and providing the point lights to the first photoresist layer or the second photoresist layer.

15. The exposure method of claim 14, further comprising:

adjusting relative spacing between adjacent point lights before providing the point lights to the first photoresist layer or the second photoresist layer.

16. The exposure method of claim 14, wherein propagation of each point light is individually controlled.

17. The exposure method of claim 9, wherein inspecting the error comprises:

inspecting line edge roughness of the first photoresist pattern or the second photoresist pattern.

18. The exposure method of claim 9, wherein the error is inspected in three or more directions.

* * * * *